United States Patent [19]

Mijuskovic et al.

[11] Patent Number: 5,126,691

[45] Date of Patent: Jun. 30, 1992

[54] VARIABLE CLOCK DELAY CIRCUIT

[75] Inventors: Dejan Mijuskovic, Chandler; Jeffrey A. Porter, Tempe, both of Ariz.

[73] Assignee: Motorola, Inc., Schaumburg, Ill.

[21] Appl. No.: 715,960

[22] Filed: Jun. 17, 1991

[51] Int. Cl.[5] ............... H03B 27/00; H03L 7/06; H03L 7/099

[52] U.S. Cl. .................... 331/1 A; 331/45

[58] Field of Search ............. 331/1 A, 34, 45, 57, 331/177 R, DIG. 3

[56] References Cited

U.S. PATENT DOCUMENTS

| | | | |
|---|---|---|---|
| 4,494,021 | 1/1985 | Bell et al. | 331/57 X |
| 4,706,040 | 11/1987 | Mehrgardt | 331/1 A |

OTHER PUBLICATIONS

A 30-MHz Hybrid Analog/Digital Clock Recovery Circuit in 2-μm CMOS, by: Kim, Helman and Gray.
Design of PLL-Based Clock Generation Circuit, by: Jeong, Borriello, Hodges and Katz.
A Monolithic CMOS 10 MHz DPLL for Burst-Mode Data Retiming, by: Sontag and Leonowich.
Gazelle Part GA1110.

*Primary Examiner*—David Mis
*Attorney, Agent, or Firm*—Bradley J. Botsch

[57] ABSTRACT

A variable clock delay circuit provides a clock output signal (CLKOUT) whose phase can be varied with respect to an incoming reference signal (REFIN). A voltage controlled ring oscillator (24) having a plurality of delay stages (26-33) locks to a predetermined factor of the frequency of the incoming reference signal. A multiplexer circuit (14) selectively provides a signal (or its inversion thereof) appearing at a selected input of any one of the plurality of delay stages to its output. A divider circuit (16) divides the signal appearing at the output of the multiplexer circuit by the predetermined factor to obtain the clock output signal whose frequency is substantially equal to the frequency of the incoming reference signal and whose phase can be adjusted with respect to the incoming reference signal.

8 Claims, 3 Drawing Sheets

VARIABLE CLOCK DELAY CIRCUIT

BACKGROUND OF THE INVENTION

This invention relates to circuits and, in particular, to variable clock delay circuits.

Tapped delay lines may be used in clock generation circuits to provide an output clock signal whose phase can be varied with respect to an incoming reference signal. Tapped delay lines which are phase locked to a clock source essentially divide the period of the incoming reference signal into a predetermined number of time samples whereby these time samples can be utilized to vary the phase of the output clock signal. However, if an increase in resolution of the delay line is desired, more time samples are needed and, thus, the complexity of the delay line increases. For example, if the phase of the output clock signal is to be adjusted to a resolution of one-eighth of the period of the incoming reference signal, an eight tap delay line is required.

One attempt that prior art has made to generate different clock phases from an incoming reference signal is to replace the tap delay line with a phase locked-loop (PLL) circuit whereby a voltage controlled oscillator (VCO) of the PLL circuit includes a predetermined number of delay stages. By utilizing this method, if N delay stages of the VCO are used, then two times N (2N) clock phases of the incoming reference signal can be obtained via the rising and falling transitions occurring at each output of each of the N delay stages. However, this method only yields a 2-to-1 improvement and, thus, for high clock phase resolution, a large number of delay stages are still required.

Another attempt that prior art has made to vary the phase of an output clock signal with respect to an incoming reference signal is to multiply the frequency of the incoming reference signal of a PLL circuit by a predetermined factor thereby forcing the VCO of the PLL circuit to operate at a higher frequency than the incoming reference signal. The clock transitions of the higher frequency signal of the VCO are then utilized to provide clock phase adjustments. However, the phase resolution of the output clock signal is proportional to the predetermined factor. Thus, if a high resolution is desired, then a high predetermined factor is required thereby requiring the VCO to operate at a substantially high frequency.

Hence, there exists a need for an improved circuit that provides an output clock signal whose phase can be varied with respect to an incoming reference signal while minimizing the number of delay stages required.

SUMMARY OF THE INVENTION

Briefly, there is provided a circuit responsive to an input reference signal for providing an output signal, comprising a phase locked-loop circuit responsive to the input reference signal, the phase locked-loop circuit including a voltage controled ring oscillator for providing a plurality of output signals having an operating frequency which is a predetermined factor of a frequency of the input reference signal; a multiplexer circuit having a plurality of inputs coupled to receive the plurality of output signals, the multiplexer circuit being responsive to a plurality of control signals for selectively providing one of the plurality of output signals at an output of the multiplexer circuit; and a divider circuit having an input and an output, the input of the divider circuit being coupled to the output of the multiplexer circuit, the output of the divider circuit providing the output signal of the circuit having a frequency substantially equal to a frequency of a signal appearing at the output of the multiplexer circuit divided by the predetermined factor.

The present invention will be better understood from the following detailed description taken in conjunction with the accompanying drawings.

DETAILED DESCRIPTION OF THE DRAWINGS

Figure 1:
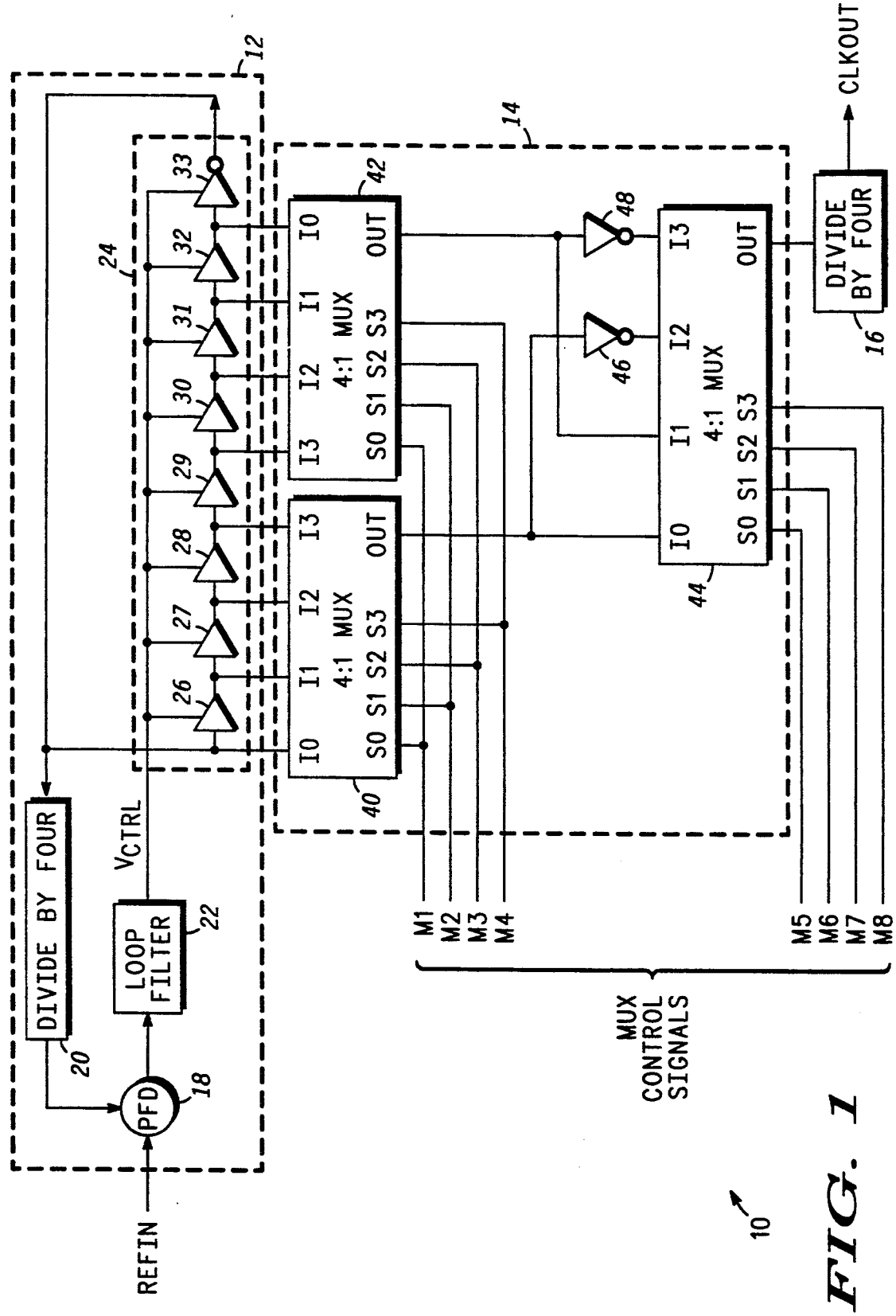
FIG. 1 is a block diagram illustrating a variable clock delay circuit in accordance with the present invention.

Referring to FIG. 1, a block diagram illustrating variable clock delay circuit 10 is shown comprising phase locked-loop circuit 12 responsive to incoming reference signal REFIN and having a plurality of outputs coupled to a plurality of inputs of multiplexer circuit 14. Multiplexer circuit 14 is controlled by a plurality of control signals (MUX CONTROL SIGNALS) and has an output for providing an output signal to an input of divide-by-four counter 16. Further, the output of divide-by-four counter 16 provides signal CLKOUT.

PLL circuit 12 includes phase/frequency detector 18 which has a first input coupled to receive incoming reference signal REFIN, while the second input of phase frequency detector 18 is coupled to the output of divide-by-four counter 20. The output of phase/frequency detector 18 is coupled to an input of loop filter 22 whereby loop filter 22 provides output voltage $V_{CTRL}$ to voltage controlled ring oscillator (VCRO) 24. An output of VCRO 24 is coupled to the input of VCRO 24 and to the input of divide-by-four counter 20.

VCRO 24 includes serially-coupled delay elements 26–33 whereby an input of each of the delay elements are coupled to an output of the previous delay element with the exception that the input of delay element 26 is coupled to the output of delay element 33. In addition, delay element 33 provides a signal at its output which is the inversion of the signal appearing at its input. It is worth noting that the input of divide-by-four counter 20 may be coupled to the output of any one of the delay elements 26–33 and, thus, is not restricted to the output of delay element 33.

In particular, delay element 26 has an input coupled to the input of VCRO 24 and an output coupled to the input of delay element 27. The output of delay element 27 is coupled to the input of delay element 28. Likewise, the outputs of delay elements 28–32 are respectively coupled to the inputs of delay elements 29–33. Further, the output of delay element 33 is coupled to the output of VCRO 24.

Output voltage $V_{CTRL}$ of loop filter 22 is supplied to delay elements 26–33. It is understood that as voltage $V_{CTRL}$ is varied, the time delay for a signal to propagate through delay elements 26–33 is also varied.

The inputs of delay elements 26–32 provide the plurality of outputs of PLL circuit 12 to multiplexer circuit 14. In particular, the inputs of delay elements 26 and 33 are respectively coupled to first inputs of 4-to-1 (4:1)

multiplexers 40 and 42. Further, the inputs of delay elements 27 and 32 are respectively coupled to second inputs of 4:1 multiplexers 40 and 42. Likewise, the inputs of delay elements 28 and 31 are respectively coupled to third inputs of 4-to-1 multiplexers 40 and 42. Finally, the inputs of delay elements 29 and 30 are respectively coupled to fourth inputs of 4-to-1 multiplexers 40 and 42.

The outputs of multiplexers and 40 and 42 are respectively provided to first and second inputs of 4-to-1 multiplexer 44. Similarly, the inverted outputs of multiplexers 40 and 42 are respectively provided to third and fourth inputs of 4-to-1 multiplexer 44 via inverters 46 and 48.

The select inputs (S0, S1, S2 and S3) of multiplexers 40, 42 and 44 are coupled to first and second groups of the plurality of control signals denoted by MUX CONTROL SIGNALS whereby the first group of the plurality of control signals includes signals M1-M4 and is respectively supplied to the S0-S3 select inputs of multiplexers 40 and 42. Similarly, the second group of the plurality of control signals includes signals M5-M8 and is respectively supplied to the S0-S3 select inputs of multiplexer 44. The output of 4-to-1 multiplexer 44 is coupled to the input of divide-by-four counter 16.

In operation, PLL circuit 12 functions such that VCRO 24 is locked to substantially four times the frequency of incoming reference signal REFIN since divide-by-four counter 20 is in the feedback path from the output of VCRO 24 to the second input of phase/frequency detector 18. Thus, the frequency of the signals appearing at the inputs of delay elements 26-33 is substantially equal to four times the frequency of signal REFIN.

For example, if the frequency of incoming reference signal REFIN is equal to 14.3 MHz, then the operating frequency of VCRO 24 ($F_{VCRO24}$) is equal to 57.2 MHz. Further, it is understood that the period of oscillation of VCRO 24 is substantially equal to two times the sum of the delays through delay elements 26-33 since it takes two complete passes through delay elements 26-33 to obtain two inversions and, thus, a complete cycle of a signal in VCRO 24.

If the delay through each of the delay elements (26-33) is denoted by time $t_1$, then time $t_1$ can be calculated from EQN. 1.

$$t_1 = 1/(2 \times 8 \times F_{VCRO24}) \quad (1)$$

For the above example of $F_{VCRO24}$ being equal to 57.2 MHz, time $t_1$ is equal to 1.093 nanoseconds (ns).

It is important to note that by operating VCRO 24 at four times the frequency of the incoming reference signal, the number of delay elements needed to obtain a resolution of 1.093 ns is equal to one-fourth the number of delay elements that would have been needed if VCRO 24 would have been operating at the frequency of the incoming reference signal.

For example, if VCRO 24 was operating at the frequency of incoming reference signal REFIN (14.3 MHz), the number of delay elements needed to obtain time $t_1 = 1.093$ ns would be 32. However, the performance or delay of a delay element is equal to the adjustment resolution ($t_1$). Thus, the complexity and power dissipation of variable clock delay circuit 10 is reduced by operating VCRO 24 at a higher frequency and utilizing fewer delay elements.

In addition, it will be shown hereinafter that time $t_1$ represents the time of the smallest clock phase adjustment for signal CLKOUT and, thus, as $t_1$ decreases, the resolution of clock phase adjustments of signal CLKOUT with respect to signal REFIN increases.

The signals appearing at each of the inputs of delay elements 26-33 are provided to the inputs of multiplexers 40 and 42 whereby multiplexer 40 selectively passes one of the signals appearing at the inputs of delay elements 26-29 to its output, while multiplexer 42 selectively passes one of the signals appearing at the inputs of delay elements 30-33 to its output. As a result, any of the signals appearing at the inputs of delay elements 26-33 can be selectively provided to either the output of multiplexer 40 or the output of multiplexer 42.

Further, the signals appearing at the outputs of multiplexers 40 and 42 are respectively provided to the first and second inputs of multiplexer 44. Likewise, the complement of the signals appearing at the output of multiplexers 40 and 42 are respectively provided to the third and fourth inputs of multiplexer 44.

It should now be clear that the true or inverted signals corresponding to the rising or falling edges of the signals appearing at the inputs of delay elements 26-33 can be selectively provided to the output of multiplexer 44. Thus, by utilizing only eight delay stages within VCRO 24, sixteen different clock phases of the signal occurring within VCRO 24 can be generated. Further, it must be understood that these sixteen clock phases are substantially equally time spaced within each period of the signal occurring in VCRO 24 by time $t_1$ wherein the period of the signal in VCRO 24 is 1/F VCRO24.

In addition, the determination of which one of these sixteen different clock phases appears at the output of multiplexer 44 is decided by the logic states of the MUX CONTROL SIGNALS. Thus, by varying the logic states of MUX CONTROL SIGNALS, one of sixteen different possible phases of the signal appearing at the output of multiplexer 44 will emerge.

For proper operation, multiplexer circuit 14 must cleanly switch between the inputs of delay elements 26-33 such that no extra or missing clock edges are supplied to divide-by-four counter 16. Multiplexer circuit 14 illustrates one implementation for accomplishing this clean switch.

In particular, the output of multiplexer 40 provides the signal appearing at its first input (I0) when a signal appearing at its select input S0 is active. Likewise, the output of multiplexer 40 respectively provides signals appearing at its second, third and fourth inputs (I1, I2 and I3) when respective signals appearing at select input S1, S2 and S3 are active. Further, the operation of multiplexers 42 and 44 is identical to the aforedescribed operation of multiplexer 40.

MUX CONTROL SIGNALS are provided to multiplexers 40, 42 and 44 such that the switching between adjacent inputs (I0 to I1, I1 to I2, I2 to I3 and I3 to I0) does not produce extra or missing clock edges at the output of multiplexer circuit 14 when the adjacent inputs are driven by clock phases separated by time $t_1$. The delay of signal CLKOUT can be smoothly increased by time $t_1$ by simultaneously activating the following pairs of MUX CONTROL SIGNALS in the order as shown in Table 1.

| SIGNAL ACTIVE TO MUXES 40 and 42 | SIGNAL ACTIVE TO MUX 44 |
|---|---|
| M1 | M5 |

-continued

| SIGNAL ACTIVE TO MUXES 40 and 42 | SIGNAL ACTIVE TO MUX 44 |
|---|---|
| M2 | M5 |
| M3 | M5 |
| M4 | M5 |
| M4 | M6 |
| M3 | M6 |
| M2 | M6 |
| M1 | M6 |
| M1 | M7 |
| M2 | M7 |
| M3 | M7 |
| M4 | M7 |
| M4 | M8 |
| M3 | M8 |
| M2 | M8 |
| M1 | M8 |

Table 1. Order of applying MUX CONTROL SIGNALS M1–M8 to achieve smooth increases of time $t_1$ in the delay of signal CLKOUT.

It is worth noting that multiplexer circuit 14 could have also produced 16 different clock phases at its output in a slightly different manner. That is, by first supplying the signals and the inversions of the signals appearing at the inputs of delay elements 26–33 to a multiplexing circuit. Then, the multiplexing circuit chooses one of the sixteen signals (representing different clock phases) to appear at its output.

However, the multiplexing circuit shown in FIG. 1 first multiplexes the eight signals appearing at the inputs of delay elements 26–33 to a first level of multiplexing (multiplexers 40 and 42). Subsequently, the true and complement (via inverters 46 and 48) output signals appearing at the outputs of the first level of multiplexing are supplied to a second level of multiplexing (multiplexer 44). As a result, the complexity of multiplexer circuit 14 is reduced.

It is also worth noting that multiplexer 14 as well as VCRO 24 can be implemented with different circuitry whereby the inversion due to inverters 33, 46 and 48 may be accomplished without delay by interchanging a signal and its corresponding complement signal.

Divide-by-four counter 16 divides the signal appearing at the output of multiplexer 44 by the same factor that incoming reference signal REFIN was multiplied to obtain the operating frequency of VCRO 24. Thus, divide-by-four counter 16 divides the signal appearing at the output of multiplexer 44 by four thereby providing signal CLKOUT which has a frequency substantially equal to one-fourth the frequency of the signal appearing at the output of multiplexer 44. Equivalently, the frequency of signal CLKOUT is substantially equal to the frequency of incoming reference signal REFIN.

Further, the resolution for a clock phase adjustment of signal CLKOUT is still time $t_1$. However, it takes four cycles of the signal appearing at the output of multiplexer 44 to generate one period of signal CLKOUT. Thus, the phase of signal CLKOUT can be adjusted to time increments of time $t_1$ which can be calculated to be 1/64 times the period of signal REFIN ($T_{REFIN}/64$).

In summary, by utilizing only eight delay stages within PLL circuit 12 and operating VCRO 24 at four times the frequency of incoming reference signal REFIN, signal CLKOUT can be adjusted to one of 64 clock phases of signal REFIN. In comparison, the prior art utilizing an eight-tap delay line in a PLL circuit would at best achieve an adjustment of 16 clock phases.

Moreover, by switching the logic states of the select input of multiplexers 40, 42 and 44 via MUX CONTROL SIGNALS, the clock phase of signal CLKOUT for the clock phase immediately preceding or following, or any other clock phase, with respect to the present phase relationship can be readily output.

Figure 2:
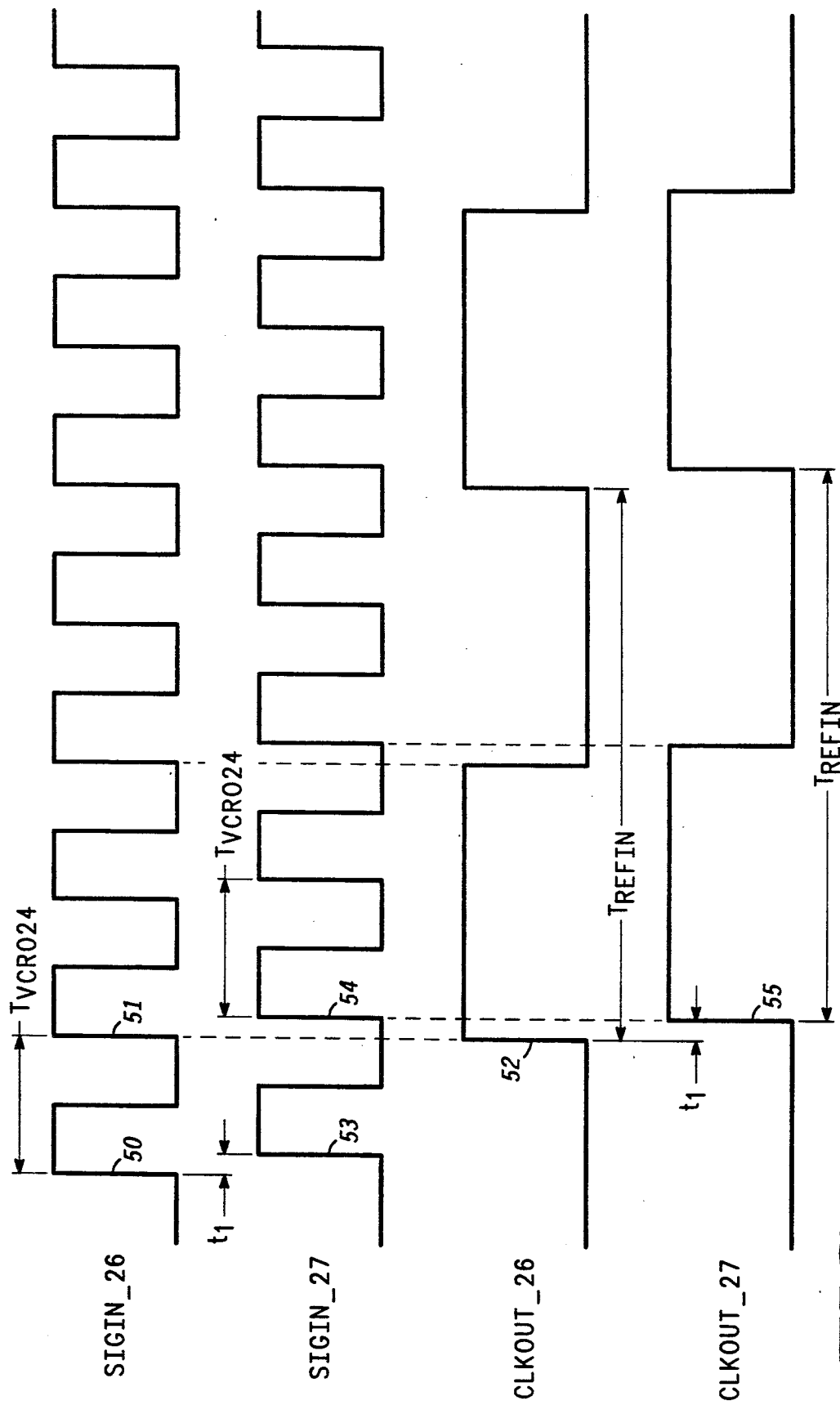
FIG. 2 is a graphical diagram illustrating selected signals of the variable clock delay circuit of FIG. 1.

Referring to FIG. 2, a graphical diagram illustrating selected signals of variable clock delay circuit 10 of FIG. 1 is shown. The top waveform represents a typical signal occurring at the input of delay element 26 as denoted by SIGIN_26, while the next waveform (second to the top) represents a typical signal occurring at the input of delay element 27 with respect to SIGIN_26 as denoted by SIGIN_27. It is understood that the frequency of SIGIN_27 is substantially equal to the frequency of signal SIGIN_26 but is delayed by time $t_1$ via the propagation delay through delay element 26.

Likewise, it is also understood that the frequency of the signals occurring at the inputs of delay elements 28–33 is substantially equal to the frequency of the signal SIGIN_26, and delayed by a factor of time $t_1$ wherein the factor corresponds to the number of delay elements traversed. Further, it is understood that the period of the signals SIGIN_26 and SIGIN_27 ($T_{VCRO24}$) is substantially equal to one-fourth the period of incoming reference signal REFIN ($T_{REFIN}$) since VCRO 24 is locked to substantially four times the frequency of the signal REFIN as aforedescribed.

Assuming that multiplexer circuit 14 is programmed, via MUX CONTROL SIGNALS, to provide the signal appearing at the input of delay element 26 at its output, the clock phase of signal CLKOUT may be represented by signal CLKOUT_26 as shown in FIG. 2.

In particular, for every two rising transitions of the signal appearing at the input of delay element 26, a logic transition on signal CLKOUT_26 results. For example, for rising transitions 50 and 51 of SIGIN_26, transition 52 occurs in signal CLKOUT_26. Therefore, the period of signal CLKOUT_26 is substantially equal to the period of the incoming reference signal REFIN ($T_{REFIN}$).

Now assume that multiplexer circuit 14 is switched and programmed, via MUX CONTROL SIGNALS, to provide the signal appearing at the input of delay element 27 at its output. The clock phase of signal CLKOUT can now be represented by signal CLKOUT_27 as shown in the bottom waveform of FIG. 2.

Similarly, for every two rising transitions of the signal appearing at the input of delay element 27, a logic transition on signal CLKOUT_27 results. For example, for rising transitions 53 and 54 of SIGIN_27, transition 55 occurs in signal CLKOUT_27. Therefore, the period of signal CLKOUT_27 is substantially equal to the period of the incoming reference signal REFIN ($T_{REFIN}$).

It must be realized that the clock phase of signal CLKOUT has been adjusted by time $t_1$ when switching multiplexer circuit 14 from outputting SIGIN_26 to outputting SIGIN_27. Further, since time $t_1$ is 1/64 times the period of signal REFIN ($T_{REFIN}/64$), a total of 64 clock phase adjustments of signal CLKOUT can be adjusted with respect to signal REFIN.

In summary, the clock phase of signal CLKOUT can be varied with respect to incoming reference signal REFIN with a resolution of time $t_1$ wherein time $t_1$ is the delay time through any one of delay elements 26–33.

Thus, by speeding up the operating frequency of VCRO 24 with respect to incoming reference signal REFIN and being able to select the proper phase of the operating signal within VCRO 24, a substantial improvement of clock phase resolution for signal CLKOUT with respect to signal REFIN is achieved.

Figure 3:
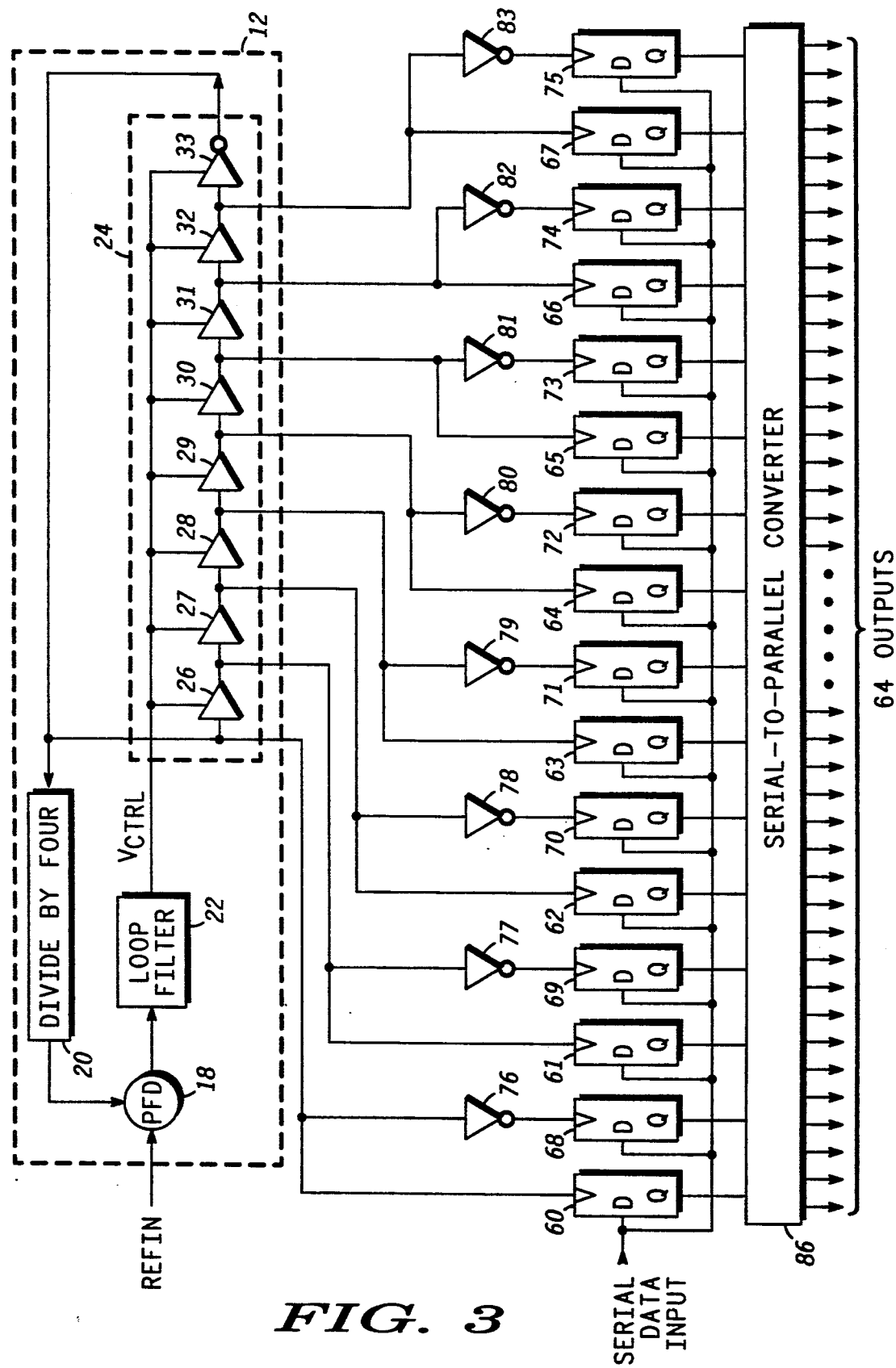
FIG. 3 is a block diagram an alternate embodiment of a variable clock delay circuit in accordance with the present invention.

Referring to FIG. 3, a block diagram illustrating an alternate embodiment of a variable clock delay circuit which may be applicable to disk drive applications is shown. It is understood that components shown in FIG. 3 which are identical to the components shown in FIG. 1 are identified by the same reference numerals.

The inputs of delay elements 26-33 are respectively coupled to the clock inputs of flip-flops 60-67. In addition, the inversion of signals occurring at the inputs of delay elements 26-33 are respectively supplied to the clock inputs of flip-flops 68-75 via inverters 76-83.

The data input of flip-flops 60-75 are respectively coupled to receive serial input data. The outputs of flip-flops 60-75 are respectively coupled to a plurality of inputs of serial-to-parallel converter 86 for providing a plurality of outputs.

The operation of PLL circuit 12 of FIG. 3 is identical to the operation of PLL circuit 12 of FIG. 1 wherein VCRO 24 is operating at a frequency substantially equal to four times the frequency of incoming reference signal REFIN.

From the foregoing discussion of variable clock delay circuit 10 of FIG. 1, it should be realized that the signals respectively applied to the clock inputs of flip-flops 60-75 represent 16 different clock phases of the operating signal in VCRO 24 with a time resolution of time $t_1$.

Further, the signals and the corresponding inversions of the signals appearing at the inputs of delay elements 26-33 are respectively applied to the clock inputs of flip-flops 60-75 so as to latch serial input data into the respective data (D) inputs of flip-flops 60-75.

The data stored in flip-flops 60-75 is transferred to serial-to-parallel converter 86 and after a predetermined number of consecutive loads, for example, 4, serial-to-parallel converter 86 provides a plurality of outputs, for example, 64.

It should be understood that the signals appearing at each output of serial-to-parallel converter 86 is phase shifted with respect to the signals appearing at its adjacent outputs by time $t_1$. Thus, the 64 output signals of serial-to-parallel converter 86 represent 64 different clock phases of incoming reference signal REFIN.

By now it should be appreciated that there has been provided a novel variable clock delay circuit for providing a clock output signal whose phase can be varied with respect to an incoming reference signal while minimizing the number of delay stages required and thereby reducing circuit complexity.

While the invention has been described in conjunction with specific embodiments thereof, it is evident that many alterations, modifications and variations will be apparent to those skilled in the art in the light of the foregoing description. Accordingly, it is intended to embrace all such alterations, modifications and variations in the appended claims.

We claim:

1. A circuit responsive to an input reference signal for providing an output signal, comprising:
    a phase locked-loop circuit responsive to the input reference signal, said phase locked-loop circuit including a voltage controlled ring oscillator for providing a plurality of output signals having an operating frequency which is a predetermined factor of a frequency of the input reference signal;
    multiplexer means having a plurality of inputs coupled to receive said plurality of output signals, said multiplexer means being responsive to a plurality of control signals for selectively providing one of said plurality of output signals at an output of said multiplexer means; and
    a divider circuit having an input and an output, said input of said divider circuit being coupled to said output of said multiplexer means, said output of said divider circuit providing the output signal of the circuit having a frequency substantially equal to a frequency of a signal appearing at said output of said multiplexer means divided by said predetermined factor;
    said multiplexer means including:
    a first level of multiplexing which includes:
        a first multiplexer having a plurality of inputs, a plurality of select inputs and an output, said plurality of inputs of said first multiplexer being responsive to a first half of said plurality of output signals, said plurality of select inputs of said first multiplexer being responsive to a first portion of said plurality of control signals; and
        a second multiplexer having a plurality of inputs, a plurality of select inputs and an output, said plurality of inputs of said second multiplexer being responsive to a second half of said plurality of output signals, said plurality of select inputs of said second multiplexer being responsive to said first portion of said plurality of control signals; and
    a second level of multiplexing which including a third multiplexer having a plurality of inputs, a plurality of select inputs and an output, said plurality of inputs of said third multiplexer being coupled to receive a true or complement version of signals appearing at said outputs of said first and second multiplexers, said plurality of select inputs of said third multiplexer being responsive to a second portion of said plurality of control signals, and said output of said third multiplexer being coupled to said input of said divider circuit.

2. The circuit according to claim 1 wherein said phase locked-loop circuit further includes:
    a phase/frequency detector having first and second inputs and an output, said first input of said phase/frequency detector coupled to receive the input reference signal;
    a loop filter having an input and an output, said input of said loop filter being coupled to said output of said phase/frequency detector, said output of said loop filter providing a control voltage to said voltage controlled ring oscillator of said phase locked-loop circuit; and
    a divider circuit having an input and an output, said input of said divider circuit of said phase-locked loop circuit being coupled to receive one of said plurality of output signals, and said output of said divider circuit of said phase-locked loop circuit being coupled to said second input of said phase/frequency detector.

3. The circuit according to claim 2 wherein said voltage controlled ring oscillator of said phase-locked loop circuit includes a plurality of serially-coupled delay stages each having an input and an output, said inputs of each one of said plurality of serially-coupled delay stages being respectively coupled to said outputs of a preceding adjacent one of said plurality of serially-coupled delay stages whereby said input of a first one of said plurality of serially-coupled delay stages is coupled to said output of a last one of said plurality of serially-coupled delay stages, each one of said plurality of serially-coupled delay stages being responsive to said control voltage of said loop filter, said inputs of each of said plurality of serially-coupled delay stages respectively providing said plurality of output signals.

4. A circuit responsive to an input reference signal for providing an output clock signal, comprising:

a phase locked-loop circuit responsive to the input reference signal, said phase locked-loop circuit including a voltage controlled ring oscillator having a plurality of serially-coupled delay stages, each one of said plurality of serially-coupled delay stages having an input and an output, said inputs of each one of said plurality of serially-coupled delay stages being respectively coupled to said outputs of a preceding adjacent one of said plurality of serially-coupled delay stages whereby said input of a first one of said plurality of serially-coupled delay stages is coupled to said output of a last one of said plurality of serially-coupled delay stages, said inputs of each of said plurality of serially-coupled delay stages respectively providing a plurality of output signals;

multiplexer means having a plurality of inputs coupled to receive said plurality of output signals, said multiplexer means being responsive to a plurality of control signals for selectively providing one of said plurality of output signals at an output of said multiplexer means; and a divider circuit having an input and an output, said input of said divider circuit being coupled to said output of said multiplexer means, said output of said divider circuit providing the output clock signal of the circuit, the output clock signal of the circuit having a frequency substantially equal to a frequency of a signal appearing at said output of said multiplexer means divided by said predetermined factor and a plurality of clock phase adjustments wherein the resolution of each one of said plurality of clock phase adjustments is substantially equal to a delay time through one of said plurality of serially-coupled delay stages;

said multiplexer means including:

a first multiplexer having a plurality of inputs, a plurality of select inputs and an output, said plurality of inputs of said first multiplexer being responsive to a first half of said plurality of output signals, said plurality of select inputs of said first multiplexer being responsive to a first portion of said plurality of control signals;

a second multiplexer having a plurality of inputs, a plurality of select inputs and an output, said plurality of inputs of said second multiplexer being responsive to a second half of said plurality of output signals, said plurality of select inputs of said second multiplexer being responsive to said first portion of said plurality of control signals; and a third multiplexer having a plurality of inputs, a plurality of select inputs and an output, said plurality of inputs of said third multiplexer being coupled to receive a true or complement version of signals appearing at said outputs of said first and second multiplexers, said plurality of select inputs of said third multiplexer being responsive to a second portion of said plurality of control signals, and said output of said third multiplexer being coupled to said input of said divider circuit.

5. The circuit according to claim 4 wherein said phase locked-loop circuit further includes:

a phase/frequency detector having first and second inputs and an output, said first input of said phase/frequency detector coupled to receive the input reference signal;

a loop filter having an input and an output, said input of said loop filter being coupled to said output of said phase/frequency detector, said output of said loop filter providing a control voltage to said voltage controlled ring oscillator of said phase locked-loop circuit; and a divider circuit having an input and an output, said input of said divider circuit of said phase-locked loop circuit being coupled to receive one of said plurality of output signals, and said output of said divider circuit of said phase-locked loop circuit being coupled to said second input of said phase/frequency detector.

6. A circuit responsive to an input reference signal for providing a plurality of output signals, comprising:

a phase locked-loop circuit responsive to the input reference signal, said phase locked-loop circuit including a voltage controlled ring oscillator for providing a plurality of output signals operating at a frequency which is a predetermined factor of a frequency of the input reference signal;

a plurality of flip-flop circuits each having a clock and a data input and an output, said clock inputs of a first half of said plurality of flip-flops being coupled to receive said plurality of output signals of said voltage controlled ring oscillator circuit, said clock inputs of a second half of said plurality of flip-flops being coupled to receive a complement version of said plurality of output signals of said voltage controlled ring oscillator circuit, said data inputs of each of said plurality of flip-flops being coupled to receive input data; and a serial-to parallel converter having a plurality of inputs and a plurality of outputs, said plurality of inputs of said serial-to-parallel converter being respectively coupled to said outputs of said plurality of flip-flops, said plurality of outputs of said serial-to-parallel converter providing the plurality of output signals of the circuit.

7. The circuit according to claim 6 wherein said phase locked-loop circuit further includes:

a phase/frequency detector having first and second inputs and an output, said first input of said phase/frequency detector coupled to receive the input reference signal;

a loop filter having an input and an output, said input of said loop filter being coupled to said output of said phase/frequency detector, said output of said loop filter providing a control voltage to said voltage controlled ring oscillator of said phase locked-loop circuit; and a divider circuit having an input and an output, said input of said divider circuit of said phase-locked loop circuit being coupled to receive one of said plurality of output signals of said voltage controlled ring oscillator, and said output of said divider circuit of said phase-locked loop circuit being coupled to said second input of said phase/frequency detector.

8. The circuit according to claim 7 wherein said voltage controlled ring oscillator of said phase-locked loop circuit includes a plurality of serially-coupled delay stages each having an input and an output, said inputs of each one of said plurality of serially-coupled delay stages being respectively coupled to said outputs of a preceding adjacent one of said plurality of serially-coupled delay stages whereby said input of a first one of said plurality of serially-coupled delay stages is coupled to said output of a last one of said plurality of serially-coupled delay stages, each one of said plurality of serially-coupled delay stages being responsive to said control voltage of said loop filter, said inputs of each of said plurality of serially-coupled delay stages respectively providing said plurality of output signals of said voltage controlled ring oscillator.

* * * * *